US012584975B2

(12) United States Patent
Li et al.

(10) Patent No.: US 12,584,975 B2
(45) Date of Patent: Mar. 24, 2026

(54) VOLTAGE AND CURRENT-SENSING-LESS SHORT-CIRCUIT PROTECTION AND LOCALIZATION FOR POWER DEVICES

(71) Applicant: The Florida State University Research Foundation, Inc., Tallahassee, FL (US)

(72) Inventors: Hui Li, Tallahassee, FL (US); Zhehui Guo, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 225 days.

(21) Appl. No.: 18/440,073

(22) Filed: Feb. 13, 2024

(65) Prior Publication Data

US 2024/0288508 A1 Aug. 29, 2024

Related U.S. Application Data

(60) Provisional application No. 63/487,335, filed on Feb. 28, 2023.

(51) Int. Cl.
G01R 31/52 (2020.01)
G01R 19/00 (2006.01)
(Continued)

(52) U.S. Cl.
CPC ......... G01R 31/52 (2020.01); G01R 19/0053 (2013.01); G01R 19/12 (2013.01); G01R 29/023 (2013.01); G01R 31/2642 (2013.01)

(58) Field of Classification Search
CPC .............. G01R 31/52; G01R 31/2642; G01R 19/0053; G01R 19/12; G01R 29/023
See application file for complete search history.

(56) References Cited

U.S. PATENT DOCUMENTS

| | | | |
|---|---|---|---|
| 6,960,915 B2* | 11/2005 | Haeuser | G01R 31/2853 |
| | | | 324/762.03 |
| 2011/0156626 A1* | 6/2011 | Mukai | B62D 5/0487 |
| | | | 318/400.21 |

(Continued)

OTHER PUBLICATIONS

B. Hu, X. Lyu, D. Xing, D. Ma, J. Brothers, R. Na and J. Wang, "A survey on recent advances of MV silicon carbide power devices," in Proc. IEEE Energy Convers. Congr. Expo., 2018, pp. 2420-2427.

(Continued)

*Primary Examiner* — Lee E Rodak
*Assistant Examiner* — Demetrius R Pretlow
(74) *Attorney, Agent, or Firm* — Meunier Carlin & Curfman LLC

(57) ABSTRACT

A short-circuit protection and localization circuit for power devices includes a first subcircuit for detecting dv/dt of a power device at turn on, a second subcircuit for short-circuit fault localization and soft turn-off of the power device, the second subcircuit including a totem-pole driver having an upper switch and a lower switch, and a third subcircuit for detecting short-circuit faults based on the output ($V_{dip}$) of the first subcircuit and the output of an upper switch ($V_p$) of the second subcircuit. The first subcircuit outputs a voltage ($V_{dip}$) having a magnitude that is proportional to dv/dt of the power device. The third subcircuit outputs a signal ($V_{sto}$) to the second subcircuit that causes the second subcircuit to softly turn-off the power device. The second subcircuit outputs a voltage of the upper switch ($V_p$) and a fault-latching signal for short-circuit localization.

20 Claims, 6 Drawing Sheets

(51) Int. Cl.
    *G01R 19/12*         (2006.01)
    *G01R 29/02*         (2006.01)
    *G01R 31/26*         (2020.01)

(56)             References Cited

U.S. PATENT DOCUMENTS

2021/0098982 A1    4/2021   Li et al.
2022/0268854 A1    8/2022   Matsubara et al.
2025/0240007 A1*   7/2025   Kim ...................... G01R 31/52

OTHER PUBLICATIONS

P. D. Reigosa, H. Luo and F. Iannuzzo, "Implications of ageing Through power cycling on the short-circuit robustness of 1.2-kV SiC MOSFETs," IEEE Trans. Power Electron., vol. 34, No. 11, pp. 11182-11190, Nov. 2019.

A. Tripathi, K. Mainali, S. Madhusoodhanan, A. Yadav, K. Vechalapu and S. Bhattacharya, "A MV intelligent gate driver for 15-kV SiC IGBT and 10-KV SiC MOSFET," in Proc. IEEE Appl. Power Electron. Conf., 2016, pp. 2076-2082.

Y. Cui, Z. Zhang, P. Yi and L. Wei, "Investigation of current mirror based overcurrent protection for 1200-V/800-A high power SiC MOSFET modules," in Proc. IEEE Energy Convers. Congr. Expo., 2019, pp. 6161-6165.

D. Rothmund, D. Bortis and J. W. Kolar, "Highly compact isolated gate driver with ultrafast overcurrent protection for 10-KV SiC MOSFETs," CPSS Trans. Power Electron. Appl., vol. 3, No. 4, pp. 278-291, Dec. 2018.

J. Wang, S. Mocevic, R. Burgos and D. Boroyevich, "High-scalability enhanced gate drivers for SiC MOSFET modules with transient immunity beyond 100 V/ns, " IEEE Trans. Power Electron., vol. 35, No. 10, pp. 10180-10199, Oct. 2020.

Z. Wang, X. Shi, Y. Xue, L. M. Tolbert, F. Wang and B. J. Blalock, "Design and performance evaluation of overcurrent protection schemes for silicon carbide (SiC) power MOSFETs," IEEE Trans. Ind. Electron. vol. 61, No. 10, pp. 5570-5581, Oct. 2014.

X. Huang et al., "Comprehensive analysis and improvement methods of noise immunity of desat protection for high voltage SiC MOSFETs with high dv/dt," IEEE Open J. Power Electron., vol. 3, pp. 36-50, 2022.

X. Lyu et al., "A reliable ultrafast short-circuit protection method for E-mode GaN Hemt," IEEE Trans. Power Electron., vol. 35, No. 9, pp. 8926-8933, Sep. 2020.

* cited by examiner

Short-Circuit Protection and Localization Circuit

Short-Circuit Fault Monitor — 206

200

$V_p$

204

$V_{dip}$ $V_{sto}$

202

PWM →

Totem Pole Driver w/ Fault Latching

Turn-On *dv/dt* Detector

Fault Signal ←

STO $V_{ds}$

Power Device

— 208

VOLTAGE AND CURRENT-SENSING-LESS SHORT-CIRCUIT PROTECTION AND LOCALIZATION FOR POWER DEVICES

CROSS-REFERENCE TO RELATED APPLICATIONS

This application claims priority to and the benefit of U.S. Provisional Patent Application No. 63/487,335, filed Feb. 28, 2023, which is incorporated herein by reference in its entirety.

BACKGROUND

Short-circuit protection is an important design consideration for power devices (e.g., MOSFETs, IGBTs, etc.). Typically, short-circuit protection techniques rely on measuring voltage or current of a device to detect a short-circuit fault; however, voltage- and current-sensing-based short-circuit protection techniques are often susceptible to switching noise and lack the fast response times needed for many types of power devices. Silicon carbide (SiC) MOSFETs, for example, have gained popularity in high-frequency and high-power applications due to their fast switching speeds, low conduction losses, and high temperature endurability but generally have a smaller die area and a higher short-circuit current than their Si-based counterparts. This results in shorter short-circuit withstand times and faster degradation under the repetitive short-circuit faults. Therefore, it would be desirable for short-circuit protection techniques utilized for power devices to have fast response times and robust noise immunity to the high dv/dt of many different types of power devices.

SUMMARY

One implementation of the present disclosure is a short-circuit protection and localization circuit for power devices. In some implementations, the circuit includes a first subcircuit for detecting dv/dt of a power device at turn on, wherein the first subcircuit outputs a voltage ($V_{dip}$) having a magnitude that is proportional to dv/dt of the power device; a second subcircuit for short-circuit fault localization and soft turn-off of the power device, the second subcircuit comprising a totem-pole driver having an upper switch and a lower switch, wherein the second subcircuit outputs a voltage of the upper switch ($V_p$) and a fault-latching signal for short-circuit localization; and a third subcircuit for detecting short-circuit faults based on the output ($V_{dip}$) of the first subcircuit and the output of the upper switch ($V_p$) of the second subcircuit, wherein the third subcircuit outputs a signal ($V_{sto}$) to the second subcircuit that causes the second subcircuit to softly turn-off the power device.

In some implementations, the first subcircuit includes an R-C differential circuit having a capacitor ($C_{sen}$) and a resistor ($R_{sen}$).

In some implementations, the voltage ($V_{dip}$) output by the first subcircuit is the voltage across the resistor ($R_{sen}$).

In some implementations, the second subcircuit includes two gate resistors ($R_{on}$, $R_{off}$) that control turn-on and turn-off switching speeds, respectively.

In some implementations, each of the two gate resistors ($R_{on}$, $R_{off}$) are sized based on desired turn-on and turn-off switching speeds for the power device, respectively.

In some implementations, the second subcircuit includes a soft turn off (STO) MOSFET and a resistor ($R_{sto}$), where the STO MOSFET and the resistor reduce gate-source voltage of the power device to initiate soft turn off of the power device.

In some implementations, the third subcircuit includes a voltage divider that scales the voltage of the upper switch ($V_p$) of the second subcircuit.

In some implementations, the third subcircuit includes a buffer to generate a pulse-width modulated signal ($V_{pwm}$) from the scaled voltage of the upper switch ($V_p$).

In some implementations, the third subcircuit includes a rising-edge delay component that delays a rising edge of the pulse-width modulated signal ($V_{pwm}$) to generate a delayed pulse-width modulated signal ($V_{pwmd}$).

In some implementations, the third subcircuit includes a resistor, a capacitor, and a diode that extract a rising edge of the pulse-width modulated signal ($V_{pwm}$).

In some implementations, the third subcircuit includes a voltage divider with a clamping diode followed by an inverted buffer and a one-shot block to generate an engagement signal ($V_{dip,eg}$) from the voltage ($V_{dip}$) output by the first subcircuit, and the engagement signal ($V_{dip,eg}$) is a one-shot pulse.

In some implementations, the third subcircuit includes: a voltage divider that scales the voltage of the upper switch ($V_p$) of the second subcircuit; a buffer to generate a pulse-width modulated signal ($V_{pwm}$) from the scaled voltage of the upper switch ($V_p$); a resistor, a capacitor, and a diode that extract a rising edge of the pulse-width modulated signal ($V_{pwm}$); a voltage divider with a clamping diode followed by an inverted buffer and a one-shot component to generate an engagement signal ($V_{dip,eg}$) from the voltage ($V_{dip}$) output by the first subcircuit, where the engagement signal ($V_{dip,eg}$) is a one-shot pulse; and an RS flip-flop which generates a signal ($V_{en}$) from the rising edge of the pulse-width modulated signal ($V_{pwm}$) and the engagement signal ($V_{dip,eg}$).

In some implementations, the third subcircuit includes a rising-edge delay component that delays a rising edge of the pulse-width modulated signal ($V_{pwm}$) to generate a delayed pulse-width modulated signal ($V_{pwmd}$), where the signal ($V_{en}$) from the RS flip-flop and the delayed pulse-width modulated signal ($V_{pwmd}$) are fed into an AND gate to generate the signal ($V_{sto}$) output by the third subcircuit.

In some implementations, the RS flip-flop includes two NOR gates.

In some implementations, a pulse width modulated (PWM) signal is provided as an input to the second subcircuit.

In some implementations, the pulse width modulated (PWM) signal and the inverted fault-latching signal output by the second subcircuit are fed into a NAND gate, and an output of the NAND gate is provided to both the upper switch and the lower switch of the second subcircuit.

In some implementations, the totem-pole driver of the second subcircuit is supplied by a positive and a negative driving voltage ($V_{cc}$, $V_{ee}$).

In some implementations, the power device is a one of a silicon (Si) MOSFET, a silicon insulated-gate bipolar transistor (Si IGBT), a gallium nitride high-electron-mobility transistor (GaN HEMT), or a silicon carbide (SiC) MOSFET.

In some implementations, the first subcircuit is connected between a drain and a source of the power device.

In some implementations, the fault-latching signal is output to an external circuit, a controller, or a computing device.

Additional advantages will be set forth in part in the description which follows or may be learned by practice.

The advantages will be realized and attained by means of the elements and combinations particularly pointed out in the appended claims. It is to be understood that both the foregoing general description and the following detailed description are exemplary and explanatory only and are not restrictive, as claimed.

Figure 1:
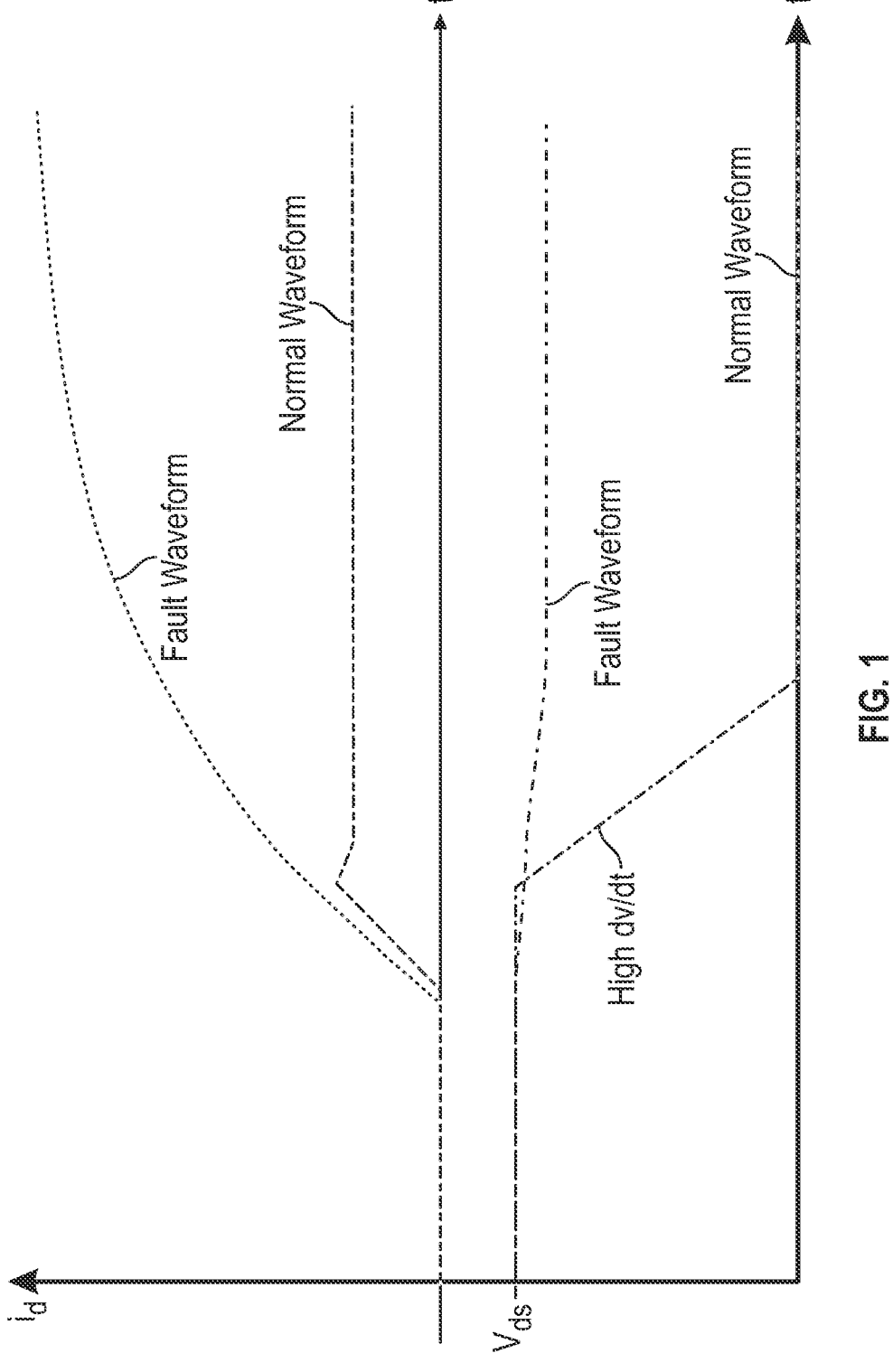
FIG. 1 is a graph of example drain-source voltage (Vs) waveforms during normal and short-circuit turn-on transients, according to some implementations.

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

As generally referred to herein, "power devices" are semiconductor devices used as switches or rectifiers in power electronics. Power devices include, but are not limited to, silicon (Si) MOSFETs, silicon insulated-gate bipolar transistors (Si IGBTs), gallium nitride high-electron-mobility transistors (GaN HEMTs), silicon carbide (SiC) MOSFETs, and the like.

A variety of different short-circuit protection methods have been developed for power devices that may be suitable in some situations but that are still broadly limited and not readily implemented. In one example, a shunt resistor for short-circuit protection can be built inside of a device package; however, it has been demonstrated that this technique induces extra loss in high-current applications. Mirror technology can reduce sensing current with a current mirror ratio of 100:1~1000:1, at the trade-off of increased complexity and device production costs. A current transformer is an alternative solution for lossless current sensing, but current transformers are known to increase a power loop path and require a dedicated insulation design in medium voltage applications. In yet another technique, the rate of change of device current (di/dt) can be sensed to reestablish a fault current shape, either by using Rogowski coil or by sensing the voltage across source terminal stray inductance. However, the former implementation (e.g., via Rogowski coil) requires a uniquely designed Rogowski coil for each different configuration or circuit. Further, Rogowski coils generally occupy a significant amount of space, making them impractical for compact devices. Sensing the voltage across source terminal stray inductance requires accessible stray inductance determined by device packages.

DESAT protection, a widely adopted technique for short-circuit protection of power devices, relies on the detection of drain-source voltage ($V_{ds}$) to monitor for both short-circuit faults at hard-switching-fault (HSF) conditions and overcurrent faults at fault-under-load (FUL) condition. DESAT protection requires an adequate blanking time to screen turn-on switching noises, such that short-circuit fault response time ends up being longer than normal turn-on transient time. Further, extra filters are often needed to improve noise immunity, which further slows short-circuit fault response speed. The DC-link voltage dip occurring at HSF conditions can be utilized to achieve ultra-fast short-circuit fault detection, in some cases. However, this technique still depends on DESAT protection to avoid false triggering and to localize the fault switch. In addition, for medium-voltage applications, this technique requires a special layout design to sense DC-link voltage. To summarize, existing short-circuit protection methods mainly monitor the magnitude of fault current or fault voltage, which is susceptible to spikes induced by fast switching of power devices; thus, resulting in frequent false triggering.

Now, referring generally to the figures, a short-circuit protection and localization circuit that addresses certain limitations of existing short-circuit protection techniques is shown, according to various implementations. In contrast to the aforementioned short-circuit protection methods, the disclosed circuit leverages the rate of change of voltage (dv/dt) of a connected power device (e.g., SiC MOSFET) for short-circuit protection. In this regard, the disclosed circuit does not directly sense voltage or current, yielding improved noise immunity in fast-switching applications (e.g., medium-voltage SiC MOSFETs). FIG. 1, for example, shows example drain-source voltage ($V_{ds}$) waveforms of a power device (e.g., a SiC MOSFET) during normal and short-circuit turn-on transients. It can be seen that $V_{ds}$ drops to zero from the DC-link voltage with a falling dv/dt during a normal turn-on transient. In contrast, $V_{ds}$ is clamped around the DC-link voltage during a short-circuit turn-on transient. This difference in dv/dt behavior can be leveraged to monitor for short-circuit faults, which not only enhances the switching noise immunity but also ensures a short-circuit fault response time shorter than the turn-on transient time. Additionally, the short-circuit protection and localization circuit described herein does not use analog comparators. Instead, digital integrated circuits (ICs) and logic gates, which have Schmitt-trigger inputs, are used to further enhance anti-noise capabilities. The disclosed circuit can be easily integrated into gate driver integrated circuits (GDICs) and other devices.

Figure 2:
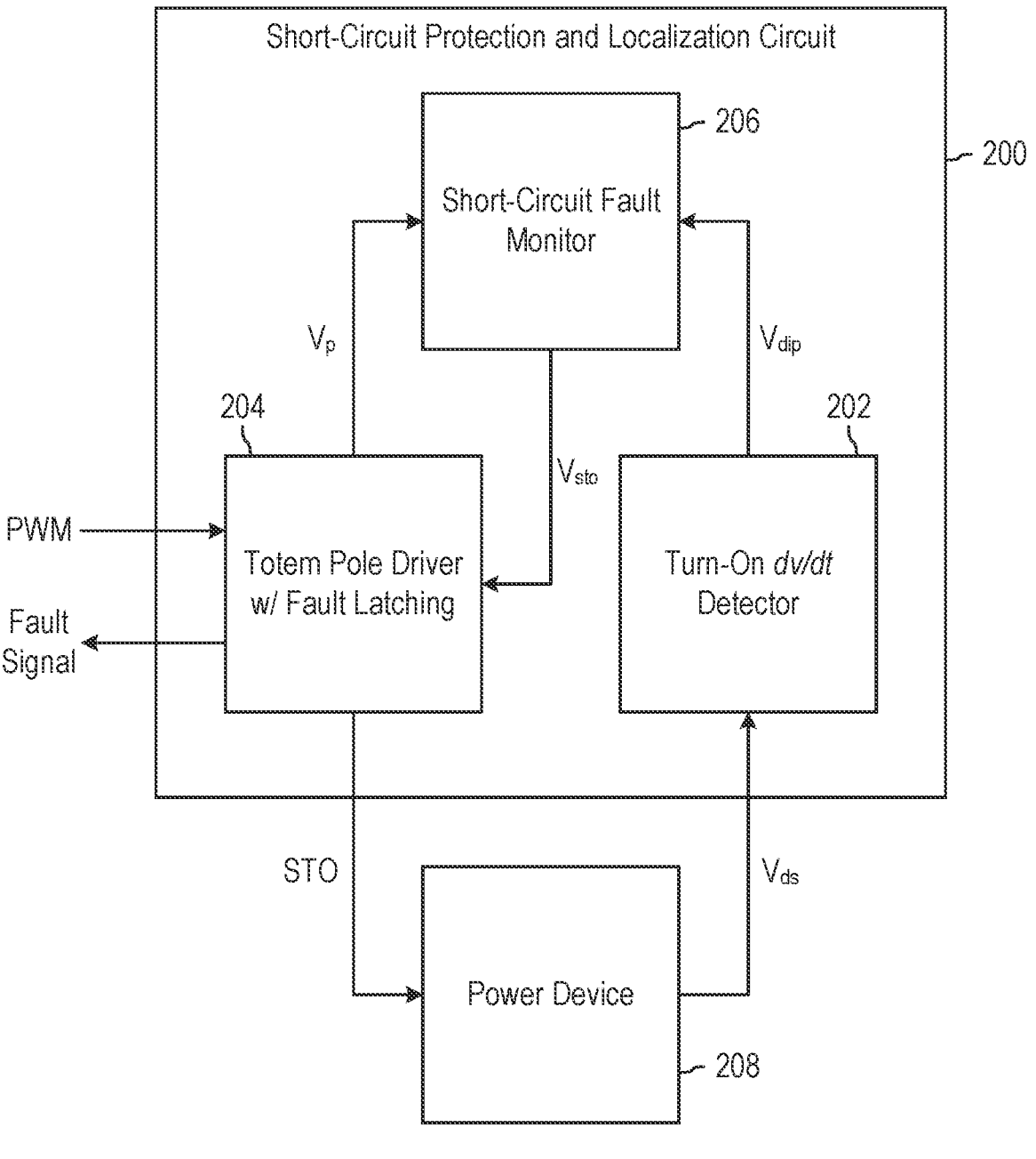
FIG. 2 is a block diagram of a short-circuit protection and localization circuit, according to some implementations.

Referring now to FIG. 2, a block diagram of a short-circuit protection and localization circuit 200 is shown, according to some implementations. As described herein, circuit 200 can generally be implemented into larger circuits and/or power devices for short-circuit fault protection and localization. In some implementations, circuit 200 can be integrated into multi-phase converters, modular converters, multilevel converters, modular multilevel converters, or other devices. Specifically, circuit 200 can be connected across power devices (e.g. Si MOSFETs, Si IGBTs, GaN HEMTs, SiC MOSFETs, and the like) of these and other electronic devices. In some implementations, multiple of circuit 200 can be included in a single device (e.g., across multiple power devices) for short-circuit fault localization.

Circuit 200 generally includes a turn-on dv/dt detecting subcircuit 202, a totem pole driver with fault latching subcircuit 204, and a short-circuit fault monitoring subcircuit 206. As shown, subcircuit 202 is generally configured to detect turn-on dv/dt of a connected power device 208, which may be a SiC MOSFET or any of the other power devices described herein. In some implementations, subcircuit 202 is positioned across the drain and source of power device 208

(e.g., a SiC MOSFET) to detect drain-source voltage ($V_{ds}$) of power device 208. Subcircuit 202 outputs, to subcircuit 206, a voltage ($V_{dip}$) having a magnitude that is proportional to dv/dt of power device 208. Subcircuit 204 generally includes a totem power driver which has an upper switch and a lower switch, as described in greater detail below with respect to FIG. 3. Subcircuit 204 is shown to output a voltage of the upper switch ($V_p$) to subcircuit 206. In some implementations, subcircuit 204 receives a pulse-width-modulated (PWM) input signal.

From both the voltage ($V_{dip}$) output by subcircuit 202 and the voltage ($V_p$) output by subcircuit 204, subcircuit 206 detects short-circuit faults in power device 208. Specifically, subcircuit 206 outputs a trigger voltage ($V_{sto}$) which is set high in the event of a short-circuit fault. The trigger voltage ($V_{sto}$) is fed back to subcircuit 204 which—if the trigger voltage ($V_{sto}$) is high (e.g., a short-circuit fault is detected)—initiates a soft turn off (STO) of power device 208. Additionally, in some implementations, subcircuit 204 further outputs a fault signal for short-circuit fault localization. The fault signal can, in some implementations, be output to another device or component such as a controller, a processor, a computer or computing device, an indicator light (e.g., an LED), or other component.

Figure 3:
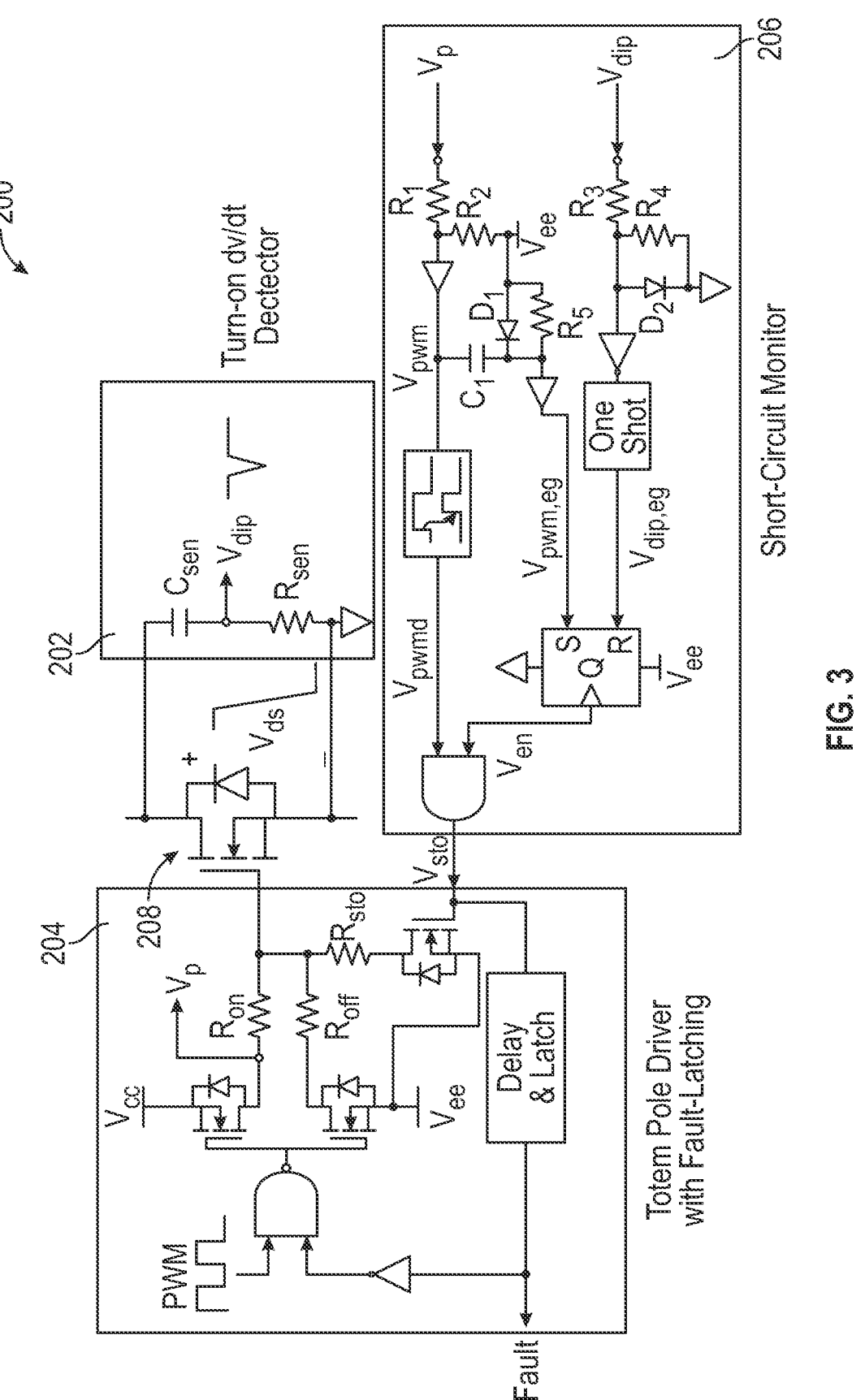
FIG. 3 is a detailed circuit diagram of the short-circuit protection and localization circuit of FIG. 2, according to some implementations.

Referring now to FIG. 3, a detailed circuit diagram of circuit 200 is shown, according to some implementations. The turn-on dv/dt of power device 208, as mentioned above, is sensed by an R-C differential circuit formed by capacitor ($C_{sen}$) and resistor ($R_{sen}$). As shown, subcircuit 202 may be connected across the drain and source of power device 208 to detect turn-on dv/dt. The voltage across ($R_{sen}$), referred to as $V_{dip}$, is approximately proportional to dv/dt, and becomes negative once a falling dv/dt is detected. $V_{dip}$ is fed to a first voltage divider of subcircuit 206 for use in detecting a short-circuit fault. In some implementations, the first voltage divider is formed by resistors $R_3$ and $R_4$, as shown. Generally, resistors $R_3$ and $R_4$ have a resistance value that is much greater than $R_{sen}$ of subcircuit 202. In some implementations, the first voltage divider includes a clamping diode, $D_2$. The scaled voltage, $V_{dip,sen}$, is then fed into an inverted buffer followed by a one-shot block to generate $V_{dip,eg}$. Thus, if a falling dv/dt causes $V_{dip,sen}$ to be lower than a buffer low-level threshold ($V_{buf,LL}$), $V_{dip,eg}$ would be set to high within the one-shot pulse. In some implementations, the criteria to set $V_{dip,eg}$ high with given $d_v/d_t$ is estimated as:

$$\frac{C_{sen}R_{sen}R_4}{R_3+R_4}dv/dt\left(1-e^{-\frac{R_3+R_4}{C_{d2}R_3R_4}\frac{V_{dc}}{dv/dt}}\right) < V_{ee} + V_{buf,LL}$$

where the inverted buffer has a reference ground of $V_{ee}$, and $C_{d2}$ is the parasitic capacitor of $D_2$.

Subcircuit 204 is generally shown to include a totem pole driver formed of an upper switch and a lower switch. In some implementations, upper and lower switches are MOSFETs. In some such implementations, the gates of the upper and lower switches are coupled to the output of a NAND gate, into which a pulse width modulated (PWM) signal is fed. In some implementations, the PWM signal is provided by an external component, such as a microcontroller, external circuit, or the like. In some implementations, as described in greater detail below, a fault signal (e.g., which is triggered or set high when a short-circuit fault is detected) is inverted and then fed into the NAND gate. In this manner, the output of the NAND gate is set high once the fault signal is high. As shown, the totem pole driver is supplied by positive and negative driving voltages, $V_{cc}$ and $V_{ee}$, respectively. Two gate resistors, $R_{on}$ and $R_{off}$, are used to separately adjust turn-on and turn-off switching speeds of power device 208. In some implementations, a STO MOSFET and resistor ($R_{sto}$) reduce the gate-source voltage of power device 208 to initiate soft turn off when a short-circuit fault occurs, as will be described in greater detail below.

As shown, $V_p$—the voltage of an upper switch of the totem pole driver—is fed to a second voltage divider of subcircuit 206 formed by resistors $R_1$ and $R_2$, and then into a buffer to generate a scaled voltage ($V_{pwm}$). In this manner, $V_{pwm}$ is synchronized with the input PWM signal of the totem-pole driver of subcircuit 204. In some implementations, subcircuit 206 includes a rising-edge delay block, which delays the rising edge of $V_{pwm}$ by an interval to generate a delayed and scaled signal, $V_{pwmd}$. In some implementations, the interval is application-specific and thus is not limited to any specific amount of time.

Additionally, the rising-edge of $V_{pwm}$ is extracted as a narrow pulse $V_{pwm,eg}$ by a resistor ($R_5$), a capacitor ($C_1$), and diode ($D_1$) of subcircuit 206. Both $V_{dip,eg}$ and $V_{pwm,eg}$ are then fed in an RS flip-flop as reset and set signals, respectively, to cause the RS flip-flow to output an engagement signal, $V_{en}$. In some implementations, the RS flip-flop is implemented with two NOR gates. $V_{en}$ and $V_{pwmd}$ are fed to an AND gate to trigger $V_{sto}$, which controls the soft turn off process of power device 208 when a short-circuit fault occurs.

Figure 4:
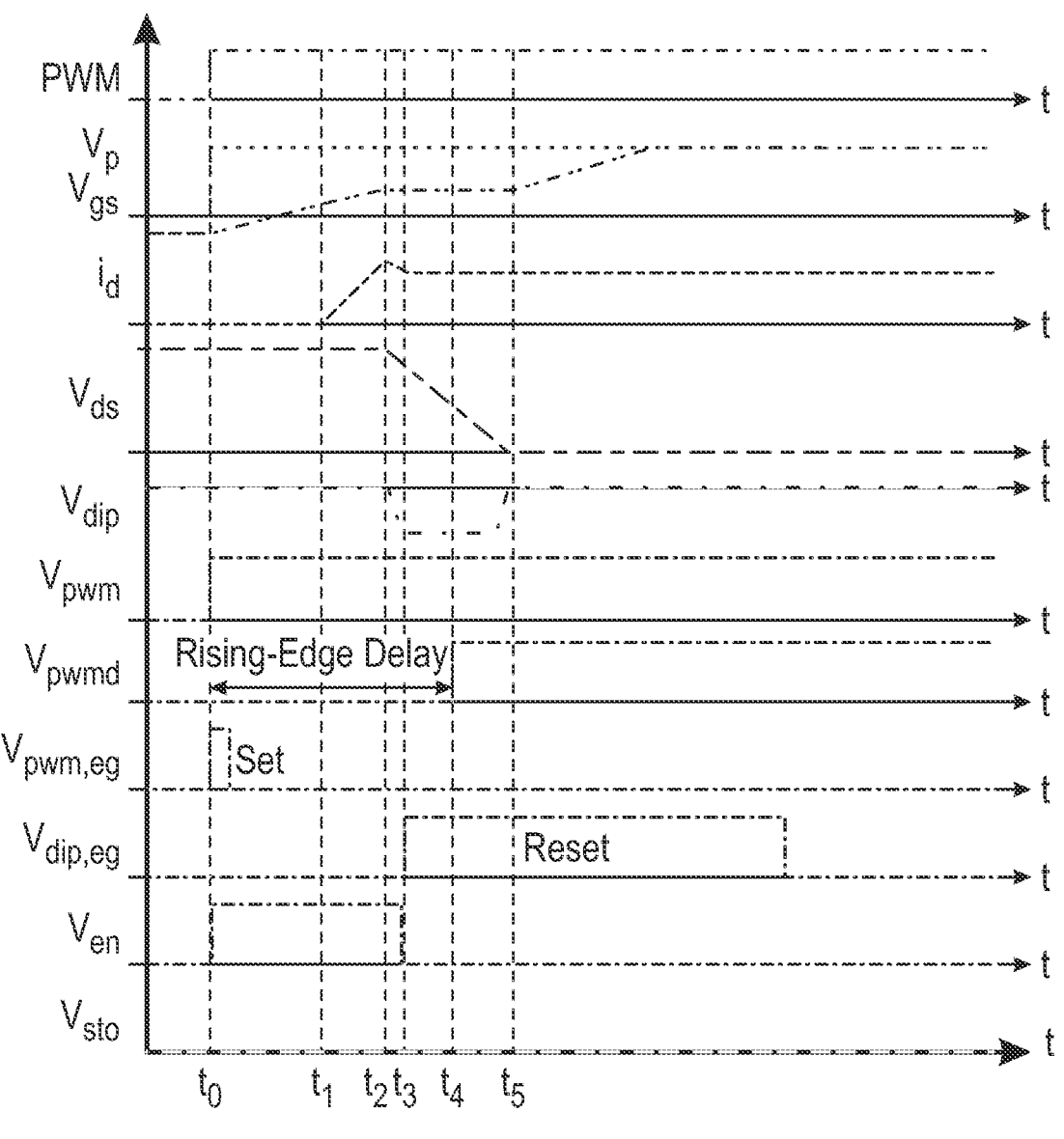
FIGS. 4-6 are graphs of operational waveforms at various points of the short-circuit protection and localization circuit of FIGS. 2 and 3, under normal conditions and during a short-circuit fault, according to some implementations.
Figure 5:
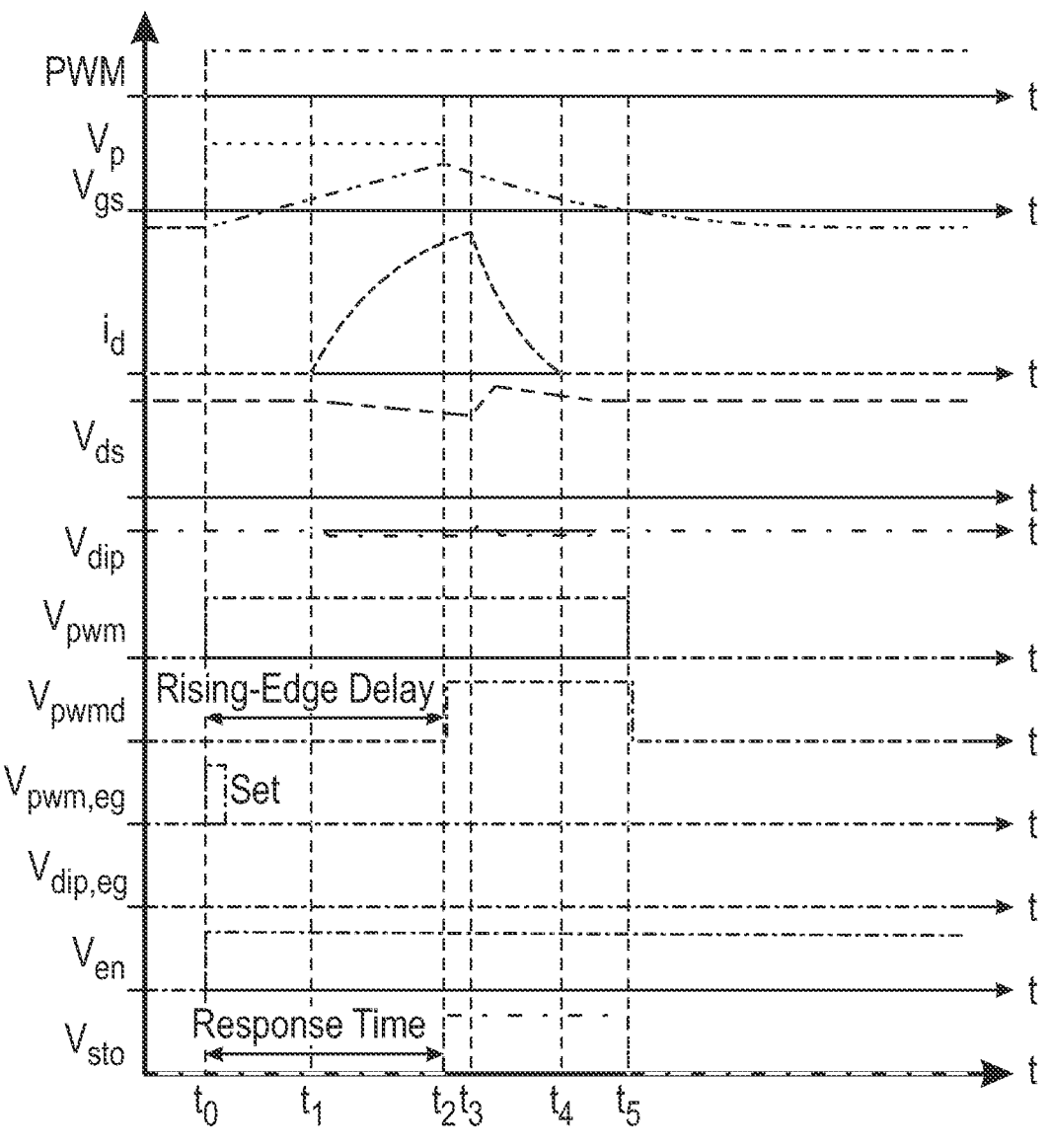
Figure 6:
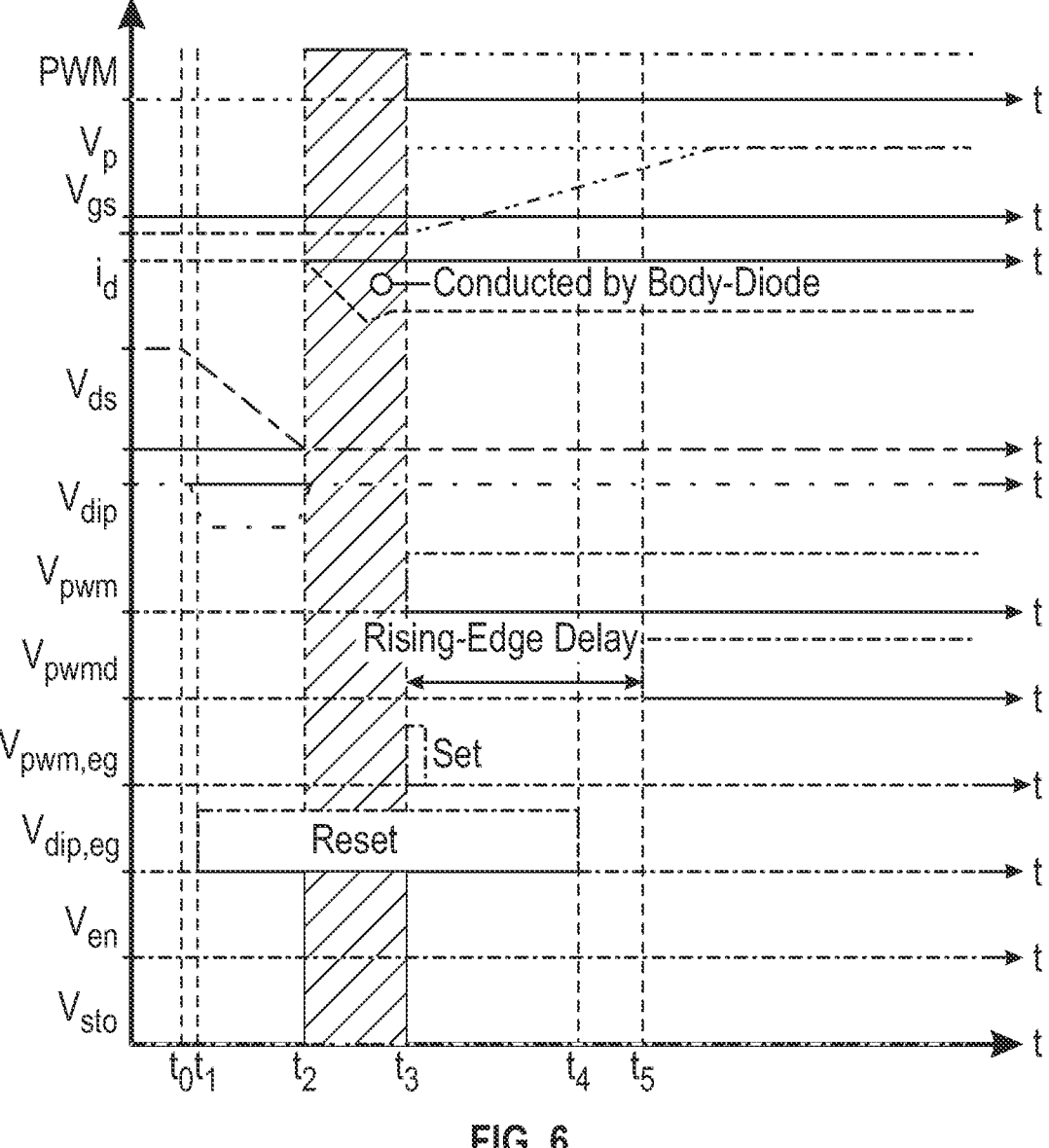

A key principle of dv/dt sensing-based short-circuit protection, as implemented by circuit 200, is that short-circuit protection is triggered automatically if no falling dv/dt is detected within a predetermined interval after power device 208 is turned on. Example operational waveforms of circuit 200 are illustrated in FIGS. 4-6 which illustrate this point. FIG. 4, in particular, is an example graph illustrating example operational waveforms of circuit 200 under normal turn-on conditions (e.g., no short-circuit fault); FIG. 5 is an example graph illustrating example operational waveforms of circuit 200 under a short-circuit turn-on condition; and FIG. 6 is an example graph illustrating example operational waveforms of circuit 200 under normal turn-on conditions in synchronous switch mode.

During a short-circuit fault turn-on transient, as in FIG. 5, $V_{ds}$ is clamped around the DC-link voltage and no falling dv/dt is detected. Accordingly, $V_{dip,eg}$ remains low and $V_{en}$ cannot be set back to low (e.g., after it is set to high by $V_{pwm,eg}$). Consequently, $V_{sto}$ is set to high by $V_{pwmd}$ to trigger soft turn off of power device 208 for short-circuit protection. The response time of circuit 200 is therefore the rising-edge delay time of $V_{pwmd}$ with respect to $V_{pwm}$, which should be longer than the sum of turn-on delay time ($t_{d\_on}$) and current rising time ($t_{cr}$) of power device 208 (e.g., a SiC MOSFET), as expressed by:

$$t_{sc,resp} > (t_{d\_on} + t_{cr}) = R_{on}C_{iss}\ln\frac{V_{cc}-V_{ee}}{V_{cc}-\left(V_{th}+I_L/g_{fs}\right)}$$

where $t_{sc,resp}$ is the SC response time, $I_L$ is the load current, and $C_{iss}$, $V_{th}$, and $g_{fs}$ are the input capacitance, threshold voltage, and transconductance of power device 208, respectively.

During a normal turn-on transient for the main switch (e.g., when $I_L$ flows from drain to source terminal), as shown in FIG. 4, $V_{ds}$ drops to 0 from dc-link voltage, such that a falling dv/dt is detected and $V_{dip,eg}$ is set to high. Accordingly, $V_{en}$ is set to low and short-circuit protection is not triggered. Considering that the falling dv/dt occurs prior to the turn-on transient for synchronous switch (e.g., $I_L$ flows from source to drain terminal), as shown in FIG. 5, the pulse width of $V_{dip,eg}$ (e.g., $t_1 \sim t_4$) should be long enough to ensure $V_{dip,eg}$ remain high when $V_{pwm,eg}$ is high, thus ensuring that $V_{en}$ remains low and short-circuit protection is not triggered.

The construction and arrangement of the systems and methods as shown in the various implementations are illustrative only. Although only a few implementations have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied, and the nature or number of discrete elements or positions may be altered or varied. Accordingly, all such modifications are intended to be included within the scope of the present disclosure. The order or sequence of any process or method steps may be varied or re-sequenced according to alternative implementations. Other substitutions, modifications, changes, and omissions may be made in the design, operating conditions, and arrangement of the implementations without departing from the scope of the present disclosure.

Although the figures may show a specific order of method steps, the order of the steps may differ from what is depicted. Also, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps and decision steps.

It is to be understood that the methods and systems are not limited to specific synthetic methods, specific components, or to particular compositions. It is also to be understood that the terminology used herein is for the purpose of describing particular implementations only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another implementation includes from the one particular value and/or to the other particular value. Similarly, when values are expressed as approximations, by use of the antecedent "about," it will be understood that the particular value forms another implementation. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal implementation. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific implementation or combination of implementations of the disclosed methods.

What is claimed is:

1. A circuit for short-circuit protection and localization for power devices, the circuit comprising:
   a first subcircuit for detecting dv/dt of a power device at turn on, wherein the first subcircuit outputs a voltage ($V_{dip}$) having a magnitude that is proportional to dv/dt of the power device;
   a second subcircuit for short-circuit fault localization and soft turn-off of the power device, the second subcircuit comprising a totem-pole driver having an upper switch and a lower switch, wherein the second subcircuit outputs a voltage of the upper switch ($V_p$) and a fault-latching signal for short-circuit localization; and
   a third subcircuit for detecting short-circuit faults based on the output ($V_{dip}$) of the first subcircuit and the output of the upper switch ($V_p$) of the second subcircuit, wherein the third subcircuit outputs a signal ($V_{sto}$) to the second subcircuit that causes the second subcircuit to softly turn-off the power device.

2. The circuit of claim 1, wherein the first subcircuit comprises an R-C differential circuit having a capacitor ($C_{sen}$) and a resistor ($R_{sen}$).

3. The circuit of claim 2, wherein the voltage ($V_{dip}$) output by the first subcircuit is the voltage across the resistor ($R_{sen}$).

4. The circuit of claim 1, wherein the second subcircuit comprises two gate resistors ($R_{on}$, $R_{off}$) that control turn-on and turn-off switching speeds, respectively.

5. The circuit of claim 4, wherein each of the two gate resistors ($R_{on}$, $R_{off}$) are sized based on desired turn-on and turn-off switching speeds for the power device, respectively.

6. The circuit of claim 1, wherein the second subcircuit comprises a soft turn off (STO) MOSFET and a resistor ($R_{sto}$), wherein the STO MOSFET and the resistor reduce gate-source voltage of the power device to initiate soft turn off of the power device.

7. The circuit of claim 1, wherein the third subcircuit comprises a voltage divider that scales the voltage of the upper switch ($V_p$) of the second subcircuit.

8. The circuit of claim 7, wherein the third subcircuit comprises a buffer to generate a pulse-width modulated signal ($V_{pwm}$) from the scaled voltage of the upper switch ($V_p$).

9. The circuit of claim 8, wherein the third subcircuit comprises a rising-edge delay component that delays a rising edge of the pulse-width modulated signal ($V_{pwm}$) to generate a delayed pulse-width modulated signal ($V_{pwmd}$).

10. The circuit of claim 9, wherein the third subcircuit comprises a resistor, a capacitor, and a diode that extract a rising edge of the pulse-width modulated signal ($V_{pwm}$).

11. The circuit of claim 1, wherein the third subcircuit comprises a voltage divider with a clamping diode followed by an inverted buffer and a one-shot block to generate an engagement signal ($V_{dip,eg}$) from the voltage ($V_{dip}$) output by the first subcircuit, wherein the engagement signal ($V_{dip,eg}$) is a one-shot pulse.

12. The circuit of claim 1, wherein the third subcircuit comprises:

a voltage divider that scales the voltage of the upper switch ($V_p$) of the second subcircuit;

a buffer to generate a pulse-width modulated signal ($V_{pwm}$) from the scaled voltage of the upper switch ($V_p$);

a resistor, a capacitor, and a diode that extract a rising edge of the pulse-width modulated signal ($V_{pwm}$);

a voltage divider with a clamping diode followed by an inverted buffer and a one-shot component to generate an engagement signal ($V_{dip,eg}$) from the voltage ($V_{dip}$) output by the first subcircuit, wherein the engagement signal ($V_{dip,eg}$) is a one-shot pulse; and an RS flip-flop which generates a signal ($V_{en}$) from the rising edge of the pulse-width modulated signal ($V_{pwm}$) and the engagement signal ($V_{dip,eg}$).

13. The circuit of claim 12, wherein the third subcircuit comprises a rising-edge delay component that delays a rising edge of the pulse-width modulated signal ($V_{pwm}$) to generate a delayed pulse-width modulated signal ($V_{pwmd}$), wherein the signal ($V_{en}$) from the RS flip-flop and the delayed pulse-width modulated signal ($V_{pwmd}$) are fed into an AND gate to generate the signal ($V_{sto}$) output by the third subcircuit.

14. The circuit of claim 12, wherein the RS flip-flop comprises two NOR gates.

15. The circuit of claim 1, wherein a pulse width modulated (PWM) signal is provided as an input to the second subcircuit.

16. The circuit of claim 15, wherein the pulse width modulated (PWM) signal and the fault-latching signal output by the second subcircuit are fed into a NAND gate, and wherein an output of the NAND gate is provided to both the upper switch and the lower switch of the second subcircuit.

17. The circuit of claim 1, wherein the totem-pole driver of the second subcircuit is supplied by a positive and a negative driving voltage ($V_{cc}$, $V_{ee}$).

18. The circuit of claim 1, wherein the power device is one of a silicon (Si) MOSFET, a silicon insulated-gate bipolar transistor (Si IGBT), a gallium nitride high-electron-mobility transistor (GaN HEMT), or a silicon carbide (SiC) MOSFET.

19. The circuit of claim 18, wherein the first subcircuit is connected between a drain and a source of the power device.

20. The circuit of claim 1, wherein the fault-latching signal is output to an external circuit, a controller, or a computing device.

\* \* \* \* \*